(12) United States Patent
Chung et al.

(10) Patent No.: US 6,683,001 B2
(45) Date of Patent: Jan. 27, 2004

(54) METHOD FOR MANUFACTURING A SEMICONDUCTOR DEVICE WHEREBY DEGRADATION OF SURFACE MORPHOLOGY OF A METAL LAYER FROM THERMAL OXIDATION IS SUPPRESSED

(75) Inventors: Eun-ae Chung, Kyungki-do (KR); Doo-sup Hwang, Kyungki-do (KR); Cha-young Yoo, Kyungki-do (KR)

(73) Assignee: Samsung Electronic Co., Ltd. (KR)

( * ) Notice: Subject to any disclaimer, the term of this patent is extended or adjusted under 35 U.S.C. 154(b) by 0 days.

(21) Appl. No.: 10/101,353

(22) Filed: Mar. 19, 2002

(65) Prior Publication Data

US 2002/0146913 A1 Oct. 10, 2002

(30) Foreign Application Priority Data

Apr. 10, 2001 (KR) .......................................... 2001-18961

(51) Int. Cl.[7] .......................... H01L 21/00; H01L 21/44
(52) U.S. Cl. .......................... 438/686; 438/3; 438/575; 438/580; 438/650; 438/240; 438/104
(58) Field of Search ................................. 438/398, 240, 438/255, 238, 239, 785, 790, 660

(56) References Cited

U.S. PATENT DOCUMENTS

| | | | | |
|---|---|---|---|---|
| 5,780,115 A | * | 7/1998 | Park et al. .................. | 427/539 |
| 5,972,722 A | * | 10/1999 | Visokay et al. ............. | 438/240 |
| 6,184,073 B1 | * | 2/2001 | Lage et al. ................. | 438/238 |
| 6,204,203 B1 | * | 3/2001 | Narwankar et al. ......... | 438/785 |
| 6,326,316 B1 | * | 12/2001 | Kiyotoshi et al. .......... | 438/763 |
| 6,395,053 B1 | * | 5/2002 | Fau et al. ...................... | 75/362 |
| 6,399,459 B2 | * | 6/2002 | Al-Shareef et al. ......... | 438/240 |
| 6,417,042 B2 | * | 7/2002 | Song et al. .................. | 438/240 |

FOREIGN PATENT DOCUMENTS

| | | |
|---|---|---|
| JP | 2000-208440 | 7/2000 |
| KR | 2000-044608 | 7/2000 |

* cited by examiner

*Primary Examiner*—Carl Whitehead, Jr.
*Assistant Examiner*—David L. Hogans
(74) *Attorney, Agent, or Firm*—Myers Bigel Sibley & Sajovec

(57) ABSTRACT

A method of manufacturing a semiconductor device having a metal layer is provided in which variation of surface morphology resulting from thermal oxidation is suppressed. The metal layer is pretreated at a first temperature so that an upper surface of the metal layer is changed into a mixed phase of metal and oxygen and becomes substantially resistant to further oxidation during a subsequent heating at a higher temperature in an oxygen atmosphere.

22 Claims, 7 Drawing Sheets

METHOD FOR MANUFACTURING A SEMICONDUCTOR DEVICE WHEREBY DEGRADATION OF SURFACE MORPHOLOGY OF A METAL LAYER FROM THERMAL OXIDATION IS SUPPRESSED

RELATED APPLICATION

This application relies for priority upon Korean Patent Application No. 2001-18961, filed on Apr. 10, 2001, the contents of which are herein incorporated by reference in their entirety.

FIELD OF THE INVENTION

The present invention relates to a method for manufacturing a semiconductor device having a metal layer.

BACKGROUND OF THE INVENTION

In integrated circuits, such as semiconductor devices, insulating layers and conductive layers are arranged in vertical and horizontal directions by a predetermined rule, and devices such as transistors, capacitors, interconnection layers, and plugs for connecting to interconnection layers, are formed by such arrangements. However, when semiconductor devices are formed on an upper portion of a first already-formed semiconductor device, the electrical characteristics of the firstly formed device may be changed and degraded by the later formed semiconductor device.

An example of variation in the characteristics of a first semiconductor device resulting from a subsequent process in the formation of a second semiconductor device can be found in a capacitor. In general, when manufacturing a capacitor, a lower electrode is first formed of a conductive material on a substrate, and a dielectric layer is formed on an upper portion of the lower electrode. Before forming an upper electrode on the dielectric layer, the dielectric layer is crystallized by annealing at about 700° C. to improve the dielectric property of the capacitor. Next, the upper electrode is formed of a conductive material on the crystallized dielectric layer. In order to reduce leakage current caused by crystallization annealing at 700° C., curing is performed at about 400° C. in an oxygen atmosphere.

In a conventional metal-insulator-semiconductor (MIS) capacitor, polysilicon is used as a conductive material for a lower electrode and metal is used as a conductive material for an upper electrode. However, in more highly integrated semiconductor devices, the use of metal-insulator-metal (MIM) capacitors, in which lower and upper electrodes are formed of metal, is more common. Recently, noble metals such as platinum (Pt), ruthenium (Ru), iridium (Ir), rhodium (Rh), and osmium (Os), which do not react with the dielectric layer and have a high work function value, are used as upper and/or lower electrodes of capacitors.

Among the above metals, there is little reaction of Pt with oxygen at an interface with a dielectric layer of the oxide family, so that the surface of the Pt does not significantly oxidize even in a high temperature heating process in an oxygen atmosphere where crystallization annealing and curing are performed to improve the dielectric property. However, the surface of metals such as Ru, Ir, palladium (Pd), Rh, or Os, can be easily oxidized in a crystallization annealing and/or curing process, which may cause the metal oxide surface to have an expanded volume, increased surface roughness, and more varied surface morphology. These effects can be particularly significant when using a curing process to improve an interfacial property between an upper electrode and a dielectric layer at over 400° C.

In more highly integrated semiconductor devices, electrodes of a capacitor are typically thinner, and metal oxide is typically formed at lower temperatures. For example, a photo of a state in which a ruthenium (Ru) layer having a thickness of 1000 Å is heated (cured) in an oxygen atmosphere at 400° C., is shown in FIG. 1A, and a photo of a state in which a Ru layer having a thickness of 300 Å is heated (cured) at the same temperature, is shown in FIG. 1B. As shown in FIGS. 1A and 1B, the surface roughness of the thinner layer increased more, and its surface morphology became more varied, compared to the thicker layer. As shown in FIG. 2, swells 2 of ruthenium oxide ($RuO_2$) are formed on the surface of an Ru layer 1 by thermal oxidation. The presence of the swells 2 (FIG. 2) and as shown in FIG. 1A renders the surface of Ru layer 1 not substantially flat which, when used within a capacitor, can result in an increase in the resistance and leakage current of the capacitor.

Thus, in order to reduce leakage current and resistance when using metals such as Ru, Ir, Pd, Rh, or Os to form electrodes of a capacitor, a technology for suppressing degradation of the surface of the metals is required.

SUMMARY OF THE INVENTION

According to embodiments of the present invention, methods of manufacturing a semiconductor device having a metal layer are provided which may limit changes to the surface roughness of metal layer during a curing process for the device. According to some embodiments, a metal layer is formed on a semiconductor substrate. The metal layer is pretreated by low temperature-oxidation at a first temperature, for example, about 150° C., so that an upper surface of the metal layer is changed into a mixed phase of metal and oxygen. The metal layer is then heated at a second temperature higher than the first temperature, for example, about 400° C., in an oxygen atmosphere.

In further embodiments, the metal layer is sufficiently oxidized during the low temperature oxidation pretreatment so that it is substantially resistant to further oxidation during a higher temperature heating, such as during a curing process to change a predetermined interfacial property between the metal layer and another semiconductor layer. The pretreatment is performed at a temperature and for a time duration for which the surface roughness of the metal layer is not substantially changed but for which it is rendered substantially resistant to further oxidation. By rendering the metal layer substantially resistant to further oxidation while not substantially changing its surface roughness, the surface roughness of the metal layer will be substantially resistant to change from oxidation during a subsequent higher temperature heating process.

BRIEF DESCRIPTION OF THE DRAWINGS

The present invention will become more apparent by describing in detail embodiments thereof with reference to the attached drawings in which.

DETAILED DESCRIPTION OF THE INVENTION

Figure 1A:
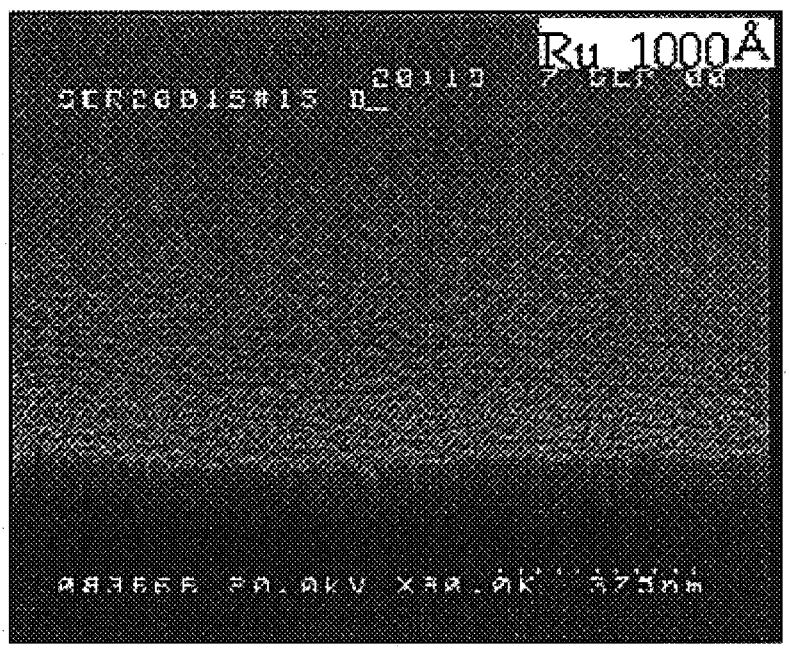
FIGS. 1A and 1B are scanning electron microscope (SEM) photos showing the surface morphology of a 1000 Å thick ruthenium (Ru) layer and a 300 Å thick ruthenium (Ru) layer, respectively, after undergoing heat treatment in an oxygen atmosphere according to the prior art.
Figure 1B:
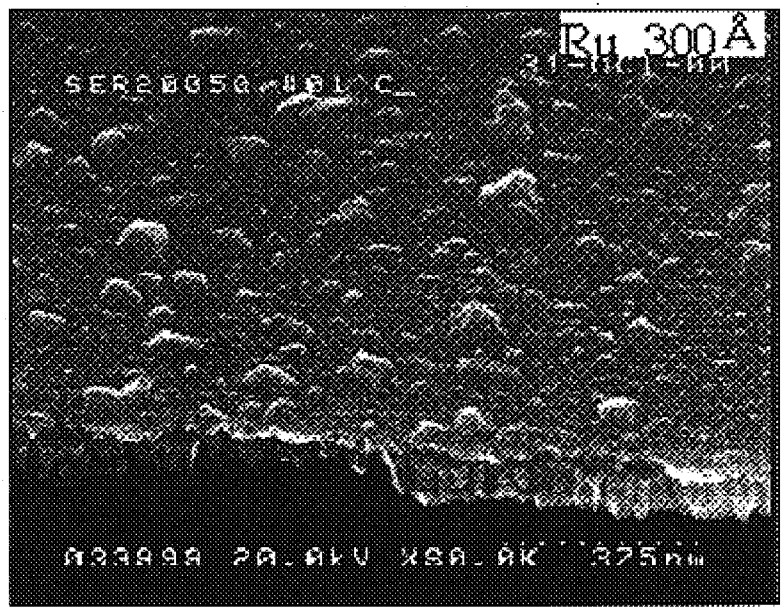
Figure 2:
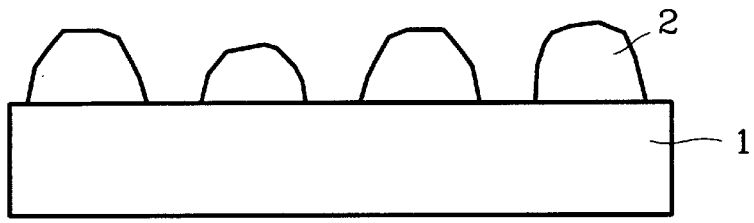
FIG. 2 illustrates ruthenium oxide ($RuO_2$) swells formed on an Ru layer by heat treating the Ru layer in an oxygen environment according to the prior art.

The present invention will now be described in greater detail with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3A:
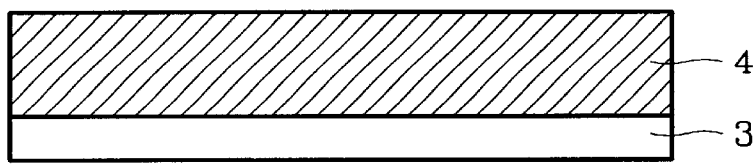
FIGS. 3A through 3C are cross-sectional views of intermediate fabrication products illustrating exemplary operations of a method for forming a metal layer using a two step heating process according to embodiments of the present invention.
Figure 3B:
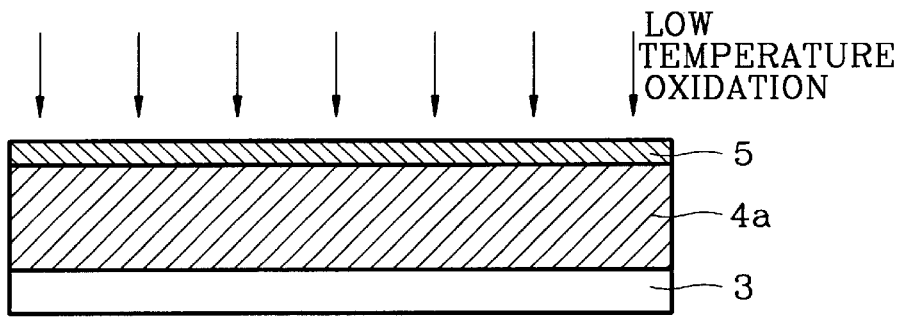
Figure 3C:
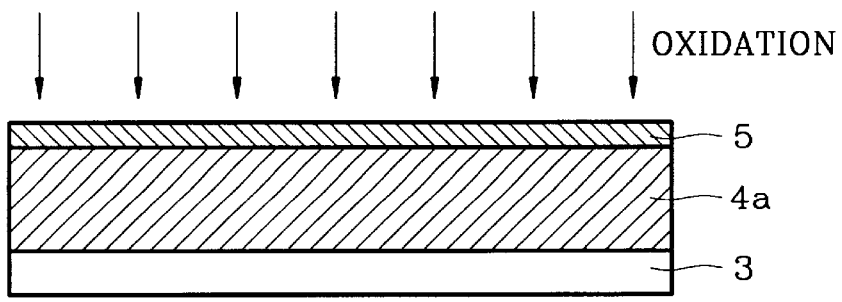
Figure 4A:
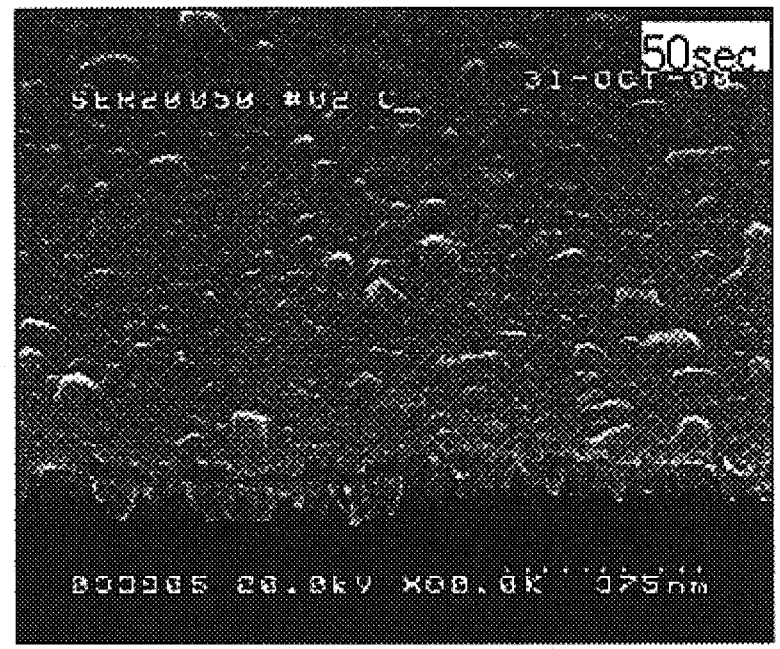
FIGS. 4A through 4E are SEM photos showing the surface morphology of the Ru layer according to variation in plasma annealing time using the method of FIGS. 3A–3C.
Figure 4B:
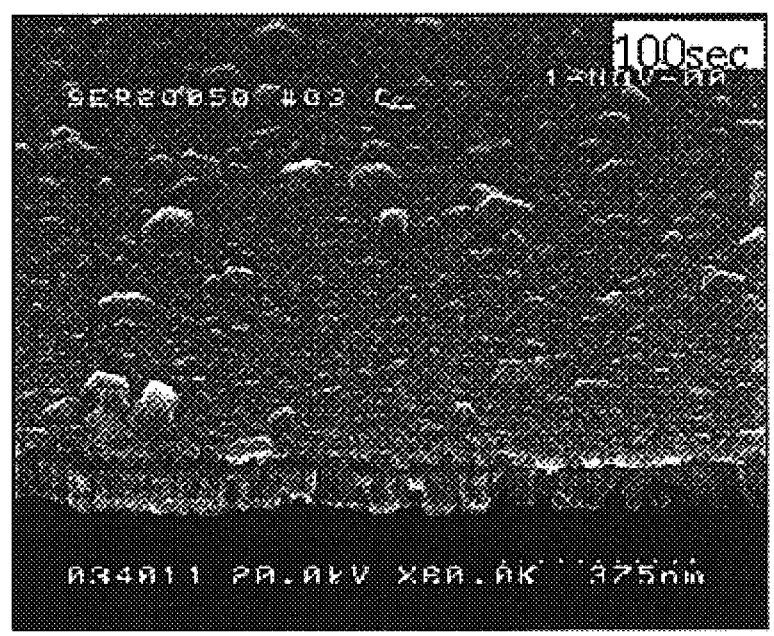
Figure 4C:
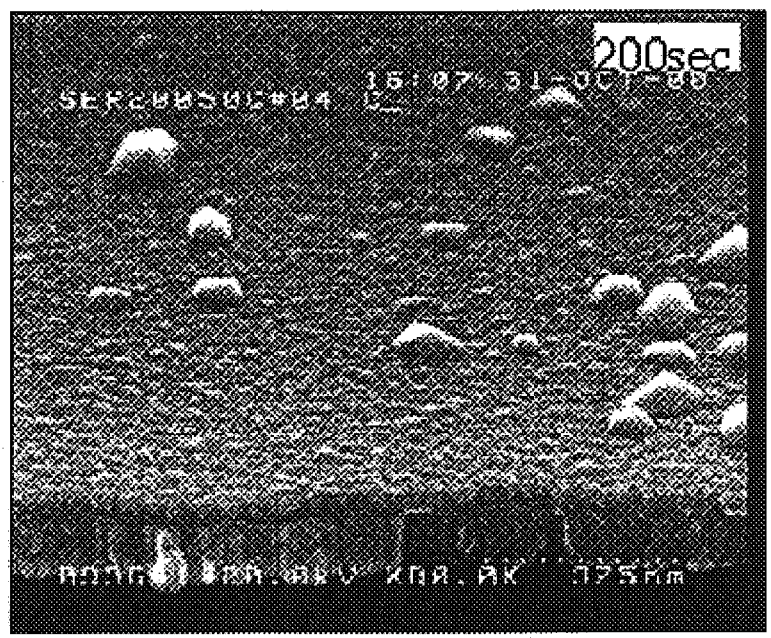
Figure 4D:
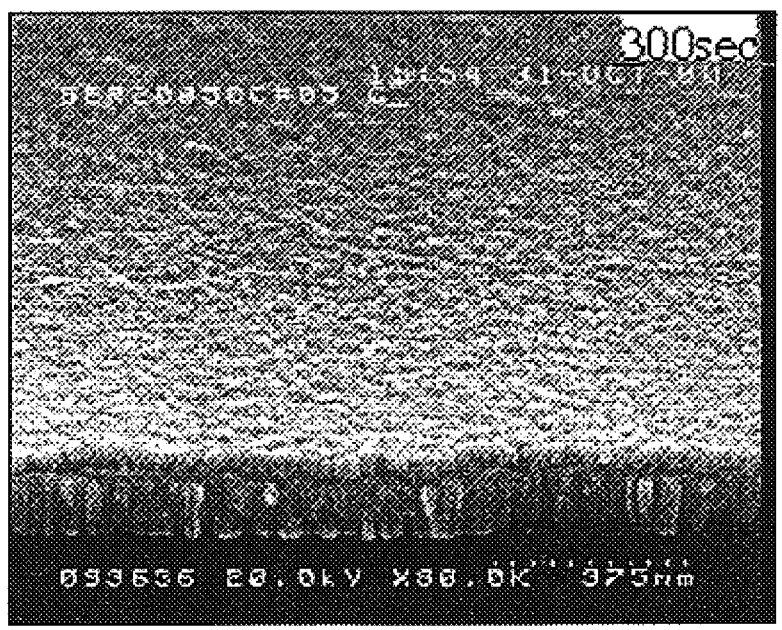
Figure 4E:
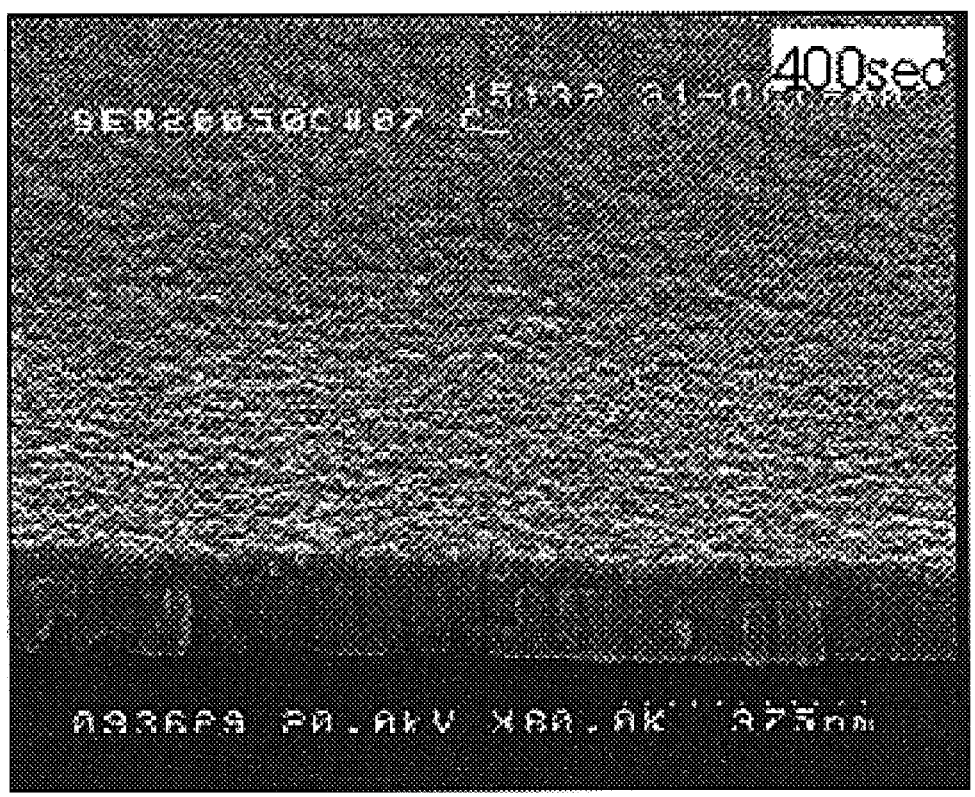

FIGS. 3A through 3C are cross-sectional views of intermediate fabrication products illustrating exemplary operations of a method for forming a metal layer using a two step heating process according to embodiments of the present invention. In FIG. 3A, a metal layer 4 is formed on an insulating layer 3 which, in turn, is formed on a semiconductor substrate (not shown). The metal layer 4 can be formed by a chemical vapor deposition (CVP) process.

In FIG. 3B, a pre-treatment process is performed in which the metal layer 4 is oxidized at a temperature lower than that of a subsequent curing process. During pre-treatment, the metal layer 4 is exposed to a plasma, including oxygen and substantially free of argon (Ar), for a predetermined time so as to change a portion of the metal layer 4 into an upper surface layer 5 of mixed phase oxygen and metal overlying a portion of 4a. The plasma may be a mixture of helium (He) and oxygen, a mixture of $N_2$ and oxygen, or one or a mixture of more than one of $N_2O$, NO and $NO_2$. Alternatively, the upper surface layer 5 of mixed phase oxygen and metal can be formed by treating the metal layer 4 with ozone ($O_3$) or $H_2O$.

In FIG. 3C, a curing process is performed in which the metal layers 4a and 5 are further heated in an oxygen atmosphere at a sufficiently higher temperature than that used for the pre-treatment process to change a predetermined interfacial electrical property between the metal layer 4a and the insulating layer 3. Since the upper surface layer 5 was formed as a mixed phase oxygen and metal by the pre-treatment process, further oxidation of the upper surface layer 5 and metal layer 4a can be substantially suppressed during the curing process. By substantially suppressing further oxidation, the surface roughness or morphology of the upper surface layer 5 can remain substantially unchanged by the curing process.

The metal layer can be formed of a material or a combination of more than one material selected from the group consisting of ruthenium (Ru), iridium (Ir), rhodium (Rh), palladium (Pd), and osmium (Os). When such a metal layer is used as an upper electrode of a capacitor, a dielectric layer formed beneath the metal layer can be formed of a material selected from the group consisting of $Ta_2O_5$, $SrTiO_3$ (STO), (Ba, Sr)$TiO_3$ (BST), $PbTiO_3$, Pb(Zr, Ti)$O_3$ (PZT), $SrBi_2Ta_2O_9$ (SBT), (Pb, La)(Zr, Ti)$O_3$, $Bi_4Ti_3O_{12}$, and $BaTiO_3$ (BTO).

The time and temperature for low temperature oxidation and curing can vary depending on the kind of metal and the thickness of the metal layer, material and thickness of the dielectric layer beneath the metal layer, and other process conditions. The temperature for low temperature oxidation and the time duration of heating are selected to be sufficiently high so that the upper surface layer 5 is oxidized in a manner to render it substantially resistant to further oxidation during the higher temperature heating of the curing process. However, the temperature and time duration for low temperature oxidation are also selected to be sufficiently low so that the roughness of the upper surface layer 5 is not substantially changed by the low temperature oxidation process. The time and temperature for the curing process are selected to sufficient for achieving a desired predetermined change in the interface electrical property between the metal layer 4a and the insulating layer 3.

The results of applying the present invention to form an Ru layer having a thickness of 300 Å are shown in FIGS. 4A through 4E, and 5. Specifically, FIGS. 4A through 4E show the results of forming the ruthenium (Ru) layer having a thickness of 300 Å on $Ba_xSr_{(1-x)}TiO_3$(BST), then pre-treating the Ru layer by exposing it to plasma formed of $O_2$(5%) and $N_2$(95%) at 150° C. for 50, 100, 200, 300, and 400 seconds, respectively, to low temperature oxidize the Ru layer, and finally curing the Ru layer in an oxygen atmosphere of 400° C. The pre-treating process forms a Ru—O mixed phase uniform layer within the upper surface of the Ru layer. The Ru—O mixed phase layer is highly resistant to oxidation and suppresses the formation of ruthenium oxide ($RuO_2$) during the subsequent curing process. Since the formation of $RuO_2$ on the surface of the Ru layer can increase the roughness of the surface of the layer, suppressing formation of $RuO_2$ during the subsequent curing process can suppress changes in the surface roughness of the Ru layer. As shown in FIGS. 4A through 4E, as the pre-treating time increases, the surface roughness of the Ru layer is changed less by the curing process. In particular, when the Ru layer is pre-treated for at least 300 seconds (FIGS. 4D and 4E), the surface roughness of the Ru layer is substantially unchanged by the curing process.

Figure 5:
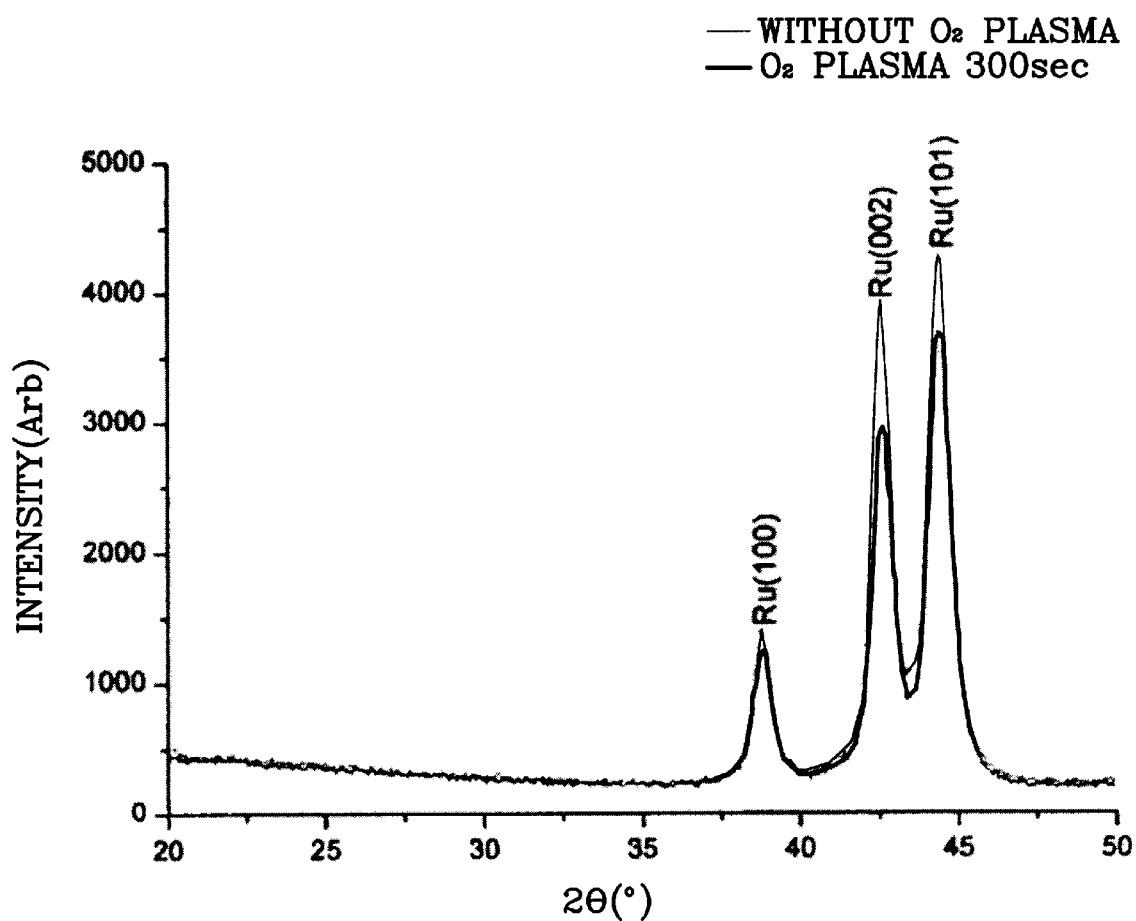
FIG. 5 is a graph illustrating the results of X-ray diffraction analysis of the surface of the Ru layer of FIG. 4D.
Figure 6:
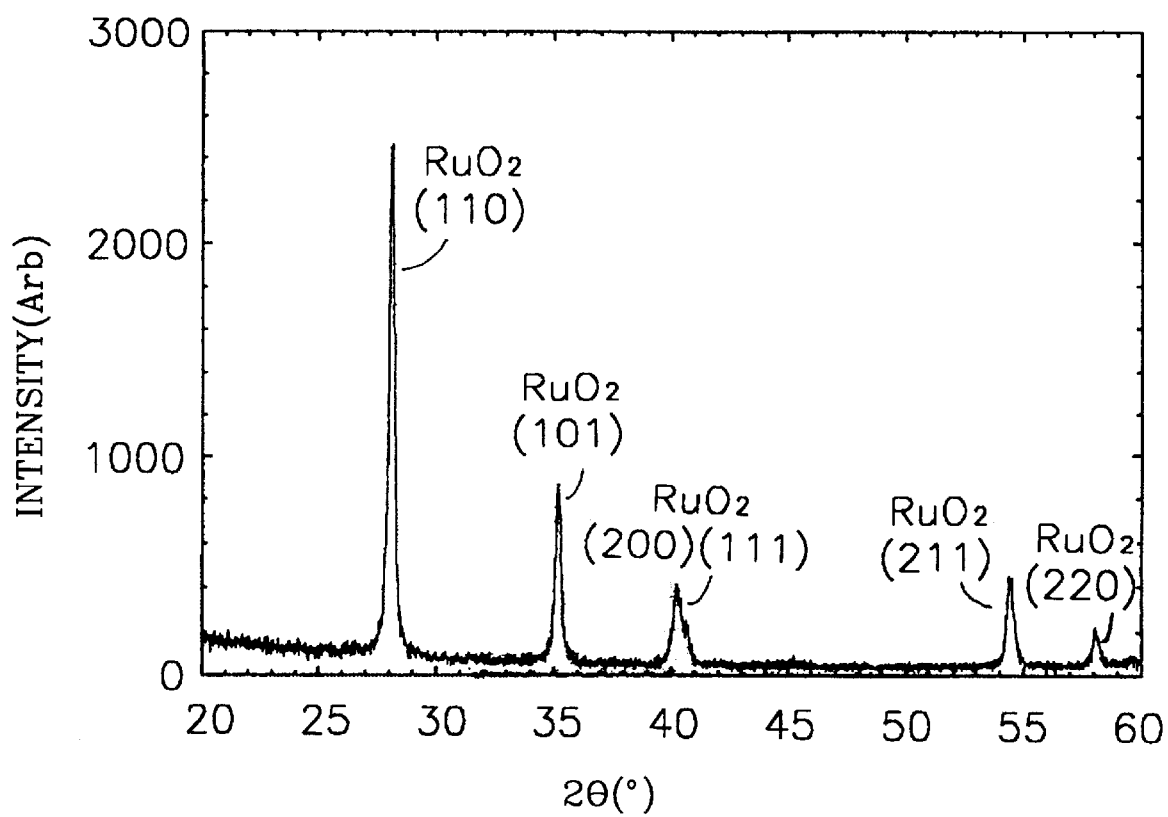
FIG. 6 is a graph illustrating the results of X-ray diffraction analysis of $RuO_2$ of a conventionally formed Ru layer.

The ability of the pre-treatment process to suppress the formation of $RuO_2$ on the surface of the Ru layer during the curing process is illustrated in FIG. 5 as compared to FIG. 6. FIG. 5 is a graph illustrating the results of x-ray diffraction analysis of the surface of the Ru layer of FIG. 4D. As shown in FIG. 5, the pre-treatment process suppressed the formation of $RuO_2$ during the curing process. In contrast, FIG. 3 shows the amount of $RuO_2$ which is formed on the Ru layer when the pre-treatment process according to the present invention is not used before a curing process.

In summary, pre-treatment of the metal layer forms a mixed phase metal and oxygen surface layer which serves to suppress oxidation of the metal layer during a subsequent curing process at a temperature which is sufficiently higher to change a predetermined interfacial property between the metal layer and another semiconductor layer. By suppressing oxidation during the curing process, the surface roughness or morphology of the upper surface layer remains substantially unchanged. For capacitors in which a dielectric is subsequently formed on the upper surface of the metal layer after the curing process, smoothness of the metal layer can contribute to an improved interface between the dielectric and the metal layer and can provide reduced leakage current in the capacitor.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a semiconductor device, the method comprising the steps of:
   (a) forming a metal layer selected from the group consisting of ruthenium (Ru), iridium (Ir), rhodium (Rh), Palladium (Pd), osmium (Os) and any combination of Ru, Ir, Rh, Pd and Os on a semiconductor substrate formed of a material selected from the group consisting of $Ta_2O_5$, $SrTiO_3$ (STO), $(Ba, Sr)TiO_3$ (BST), $PbTiO_3$, $Pb(Zr, Ti)O_3$ (PZT), $SrBi_2Ta_2O_5$ (SBT), $(Pb, La)(Zr, Ti)O_3$, $Bi_4Ti_3O_{12}$ and $BaTiO_3$ (BTO);
   (b) oxidizing an exposed surface of the metal layer at a first temperature so that the exposed surface of the metal layer is changed into an oxide film while maintaining a portion of the metal layer between the substrate and the oxide film; and
   (c) heating the metal layer and the oxide film at a second temperature higher than the first temperature in an oxygen atmosphere, after the step (b), wherein the second temperature is sufficiently high to change a predetermined electrical property of the interface between the metal layer and the semiconductor substrate.

2. The method as claimed in claim 1, wherein the metal layer is sufficiently oxidized in step (b) so that the oxide film is substantially resistant to further oxidation during the heating of step (c).

3. The method as claimed in claim 1, wherein the step of oxidizing the metal layer includes the step of exposing the metal layer to a plasma including oxygen and substantially free of argon (Ar).

4. The method as claimed in claim 1, wherein the step of oxidizing the metal layer includes the step of exposing the metal layer to a plasma including oxygen.

5. The method as claimed in claim 4, wherein the metal layer is exposed to the plasma for sufficiently long so that the oxide film is resistant to further oxidation during the heating of step (c).

6. The method as claimed in claim 4, wherein the metal layer is exposed to the plasma for over about 200 seconds.

7. The method as claimed in claim 6, wherein the metal layer is exposed to the plasma for over about 300 seconds.

8. The method as claimed in claim 3, wherein the plasma including oxygen is selected from the group consisting of a mixture of helium (He) and oxygen, a mixture of $N_2$ and oxygen, $N_2O$, NO, $NO_2$, and a mixture of more than one of $N_2O$, NO, and $NO_2$.

9. The method as claimed in claim 4, wherein the plasma including oxygen is substantially free of argon (Ar) and is selected from the group consisting of a mixture of helium (He) and oxygen, a mixture of $N_2$ and oxygen, $N_2O$, NO, $NO_2$, and a mixture of more than one of $N_2O$, NO, and $NO_2$.

10. The method as claimed in claim 1, wherein the step of oxidizing the metal layer includes the step of ozone ($O_3$) treating the metal layer.

11. The method as claimed in claim 1, wherein the first temperature is selected to be sufficiently high and a time duration for oxidizing is selected to sufficiently long to sufficiently oxidize the metal layer so that the roughness of the tipper surface of the metal layer is not substantially changed during the heating of step (c).

12. The method as claimed in claim 1, wherein the first temperature is selected to be sufficiently high and a time duration for oxidizing is selected to be sufficiently long to sufficiently oxidize the metal layer to render it substantially resistant to further oxidation during the heating of step (c).

13. The method as claimed in claim 12, wherein the first temperature is selected to be sufficiently low and a time duration for the oxidizing step (b) is selected to be sufficiently short so that the roughness of the upper surface of the metal layer is not substantially changed.

14. The method as claimed in claim 1, wherein the first temperature is sufficiently low to avoid changing the electrical properties of the interface between the metal layer and the semiconductor substrate.

15. The method as claimed in claim 1, wherein the metal layer is formed of a material selected from the group consisting of iridium (Ir), rhodium (Rh), palladium (Pd), osmium (Os), and any combination of Ir, Rh, Pd and Os.

16. The method as claimed in claim 3, wherein the metal layer is formed of ruthenium (Ru), is exposed to a plasma including nitrogen and oxygen for over about 300 seconds and is heated in an oxygen atmosphere at over about 400° C.

17. A method for manufacturing a semiconductor device, the method comprising the steps of:
   (a) forming a metal layer on a semiconductor substrate formed of a material selected from the group consisting of $Ta_2O_5$, $SrTiO_3$ (STO), $(Ba, Sr)TiO_3$ (BST), $PbTiO_3$, $Pb(Zr, Ti)O_3$ (PZT), $SrBi_2Ta_2O_5$ (SBT), $(Pb, La)(Zr, Ti)O_3$, $Bi_4Ti_3O_{12}$ and $BaTiO_3$ (BTO);
   (b) oxidizing the metal layer at a first temperature so that an exposed surface of the metal layer is changed into an oxide film while maintaining a portion of the metal layer between the substrate and the oxide film; and
   (c) heating the metal layer and the oxide film at a second temperature higher than the first temperature in an oxygen atmosphere, after the step (b), wherein the first temperature is substantially below about 400° C. and the metal layer is formed of a material selected from the group consisting of ruthenium (Ru), iridium (Ir), rhodium (Rh), palladium (Pd), osmium (Os), and any combination of Ru, Ir, Rh, Pd, and Os.

18. The method as claimed in claim 17, wherein the first temperature is about 150° C.

19. The method as claimed in claim 17, wherein the second temperature is at least about 400° C.

20. The method as claimed in claim 17, wherein the second temperature is about 400° C.

21. A method for manufacturing a semiconductor device, the method comprising the steps of:
   (a) forming a metal layer on a semiconductor substrate formed of a material selected from the group consisting of $Ta_2O_5$, $SrTiO_3$ (STO), $(Ba, Sr)TiO_3$ (BST), $PbTiO_3$, $Pb(Zr, Ti)O_3$ (PZT), $SrBi_2Ta_2O_5$ (SBT), $(Pb, La)(Zr, Ti)O_3$, $Bi_4Ti_3O_{12}$ and $BaTiO_3$ (BTO);
   (b) oxidizing the metal layer at a first temperature so that an exposed surface of the metal layer is changed into an oxide film while maintaining a portion of the metal layer between the substrate and the oxide film, wherein the oxidizing the metal layer includes exposing the metal layer to a plasma including oxygen and substantially free of argon (Ar); and
   (c) heating the metal layer and the oxide film at a second temperature higher than the first temperature in an oxygen atmosphere, after the step (b), wherein the metal layer is formed from ruthenium (RU), and wherein the oxidizing the metal layer comprises exposing the metal layer to a plasma including nitrogen and oxygen at a temperature substantially less than about 400° C. for over about 200 seconds; and heating the metal layer in an oxygen atmosphere at over about 400° C.

22. A method for manufacturing a semiconductor device, the method comprising the steps of:

(a) forming a metal layer selected from the group consisting of ruthenium (Ru), iridium (Ir), rhodium (Rh). palladium (Pd), osmium (Os) and any combination of Ru, Ir, Rh, Pd and Os on a semiconductor substrate formed of a material selected from the group consisting of $Ta_2O_5$, $SrTiO_3$ (STO), $(Ba, Sr)TiO_3$ (BST), $PbTiO_3$, $Pb(Zr, Ti)O_3$ (PZT), $SrBi_2Ta_2O_5$ (SBT), $(Pb, La)(Zr, Ti)O_3$, $Bi_4Ti_3O_{12}$ and $BaTiO_3$ (BTO);

(b) oxidizing the metal layer at a first temperature so that an exposed surface of the metal layer is changed into an oxide film while maintaining a portion of the metal layer between the substrate and the oxide film; and (c) heating the metal layer and the oxide film at a second temperature higher than the first temperature in an oxygen atmosphere, after the step (b), wherein the step of oxidizing the metal layer includes the step of $H_2O$ treating the metal layer.

* * * * *

UNITED STATES PATENT AND TRADEMARK OFFICE
CERTIFICATE OF CORRECTION

PATENT NO. : 6,683,001 B2
DATED : January 27, 2004
INVENTOR(S) : Chung et al.

It is certified that error appears in the above-identified patent and that said Letters Patent is hereby corrected as shown below:

<u>Column 6,</u>
Line 3, should read -- the upper surface of the metal layer is not substantially --

Signed and Sealed this

Thirteenth Day of July, 2004

JON W. DUDAS
*Acting Director of the United States Patent and Trademark Office*